United States Patent
Nakayama et al.

(10) Patent No.: US 9,325,295 B2
(45) Date of Patent: Apr. 26, 2016

(54) ELASTIC WAVE DEVICE WITH INTEGRATED INDUCTOR

(71) Applicant: SKYWORKS PANASONIC FILTER SOLUTIONS JAPAN CO., LTD., Kadoma-Shi (JP)

(72) Inventors: Hideaki Nakayama, Osaka-Fu (JP); Atsushi Takano, Osaka-Fu (JP); Mitsuhiro Furukawa, Hyogo-Ken (JP)

(73) Assignee: SKYWORKS PANASONIC FILTER SOLUTIONS JAPAN CO., LTD., Kadoma-Shi (JP)

( * ) Notice: Subject to any disclaimer, the term of this patent is extended or adjusted under 35 U.S.C. 154(b) by 0 days.

(21) Appl. No.: 14/809,957

(22) Filed: Jul. 27, 2015

(65) Prior Publication Data
US 2016/0036416 A1    Feb. 4, 2016

Related U.S. Application Data

(63) Continuation of application No. 13/521,239, filed as application No. PCT/JP2011/006977 on Dec. 14, 2011, now Pat. No. 9,124,239.

(30) Foreign Application Priority Data

Dec. 16, 2010  (JP) ................................. 2010-280146
Mar. 9, 2011   (JP) ................................. 2011-051194

(51) Int. Cl.
*H03H 9/72*    (2006.01)
*H03H 9/10*    (2006.01)
(Continued)

(52) U.S. Cl.
CPC .............. *H03H 9/725* (2013.01); *H03H 9/0547* (2013.01); *H03H 9/0576* (2013.01);
(Continued)

(58) Field of Classification Search
CPC ..... H03H 9/1071; H03H 9/64; H03H 9/0057; H03H 9/0547; H03H 9/0576; H03H 9/725; H03H 9/059; H03H 9/14588; H03H 9/12; H01F 38/14

USPC .......... 333/133, 193–196; 310/313 R, 313 A, 310/313 B, 313 C, 313 D, 344
See application file for complete search history.

(56) References Cited

U.S. PATENT DOCUMENTS

| | | | |
|---|---|---|---|
| 7,427,824 B2 | 9/2008 | Iwamoto et al. | |
| 7,999,632 B2 * | 8/2011 | Iwamoto | H03H 3/08 29/25.35 |

(Continued)

FOREIGN PATENT DOCUMENTS

| | | |
|---|---|---|
| JP | H08330890 A | 12/1996 |
| JP | 2001217674 A | 8/2001 |

(Continued)

OTHER PUBLICATIONS

International Application U.S. Appl. No. PCT/JP2011/006977, International Search Report mailed Mar. 6, 2012, 2 pgs.

*Primary Examiner* — Benny Lee
*Assistant Examiner* — Jorge Salazar, Jr.
(74) *Attorney, Agent, or Firm* — Lando & Anastasi, LLP (57) ABSTRACT

An elastic wave device includes an interdigital transducer (IDT) electrode disposed on an upper surface of a piezoelectric substrate, a wiring electrode disposed on the upper surface of the piezoelectric substrate and connected to the IDT electrode, and a first insulator layer disposed on the upper surface of the piezoelectric substrate. The first insulator layer seals the IDT electrode and the wiring electrode and includes a first resin and a first filler. A resin layer including no filler is provided on an upper surface of the first insulator layer. An inductor electrode is disposed on an upper surface of the resin layer. A second insulator layer is disposed on the upper surface of the resin layer and covers the inductor electrode. A terminal electrode is disposed on an upper surface of the second insulator layer. A connecting electrode electrically connects the wiring electrode, the terminal electrode, and the inductor electrode.

20 Claims, 8 Drawing Sheets

(51) Int. Cl.
*H03H 9/05* (2006.01)
*H03H 9/12* (2006.01)
*H03H 9/64* (2006.01)
*H01F 38/14* (2006.01)
*H03H 9/00* (2006.01)
*H03H 9/145* (2006.01)

(52) U.S. Cl.
CPC .............. *H03H 9/1071* (2013.01); *H03H 9/12* (2013.01); *H01F 38/14* (2013.01); *H03H 9/0057* (2013.01); *H03H 9/059* (2013.01); *H03H 9/14588* (2013.01); *H03H 9/64* (2013.01)

(56) References Cited

U.S. PATENT DOCUMENTS

2006/0139125 A1   6/2006   Shiga-ken et al.
2007/0252481 A1   11/2007  Iwamoto et al.
2009/0309673 A1   12/2009  Iwamoto

FOREIGN PATENT DOCUMENTS

| | | |
|---|---|---|
| JP | 2002217673 A | 8/2002 |
| JP | 2007214169 A | 8/2007 |
| JP | 2009010121 A | 1/2009 |
| JP | 2009182188 A | 8/2009 |
| JP | 2010062412 A | 3/2010 |
| JP | 2010135959 A | 6/2010 |
| JP | 2010136143 A | 6/2010 |
| JP | 2010157956 A | 7/2010 |
| JP | 2010193487 A | 9/2010 |
| JP | 2010200198 A | 9/2010 |
| WO | 2005055423 A1 | 6/2005 |
| WO | 2006134928 A1 | 12/2006 |
| WO | 2008/105199 A1 | 9/2008 |
| WO | 2009057699 A1 | 5/2009 |

\* cited by examiner

ELASTIC WAVE DEVICE WITH INTEGRATED INDUCTOR

RELATED APPLICATIONS

This application claims priority under 35 U.S.C. §120 as a continuation of U.S. patent application Ser. No. 13/521,239 now U.S. Pat. No. 9,124,239 B2 issued on Sep. 1, 2015, titled "ELASTIC WAVE DEVICE," filed on Jul. 10, 2012, which is herein incorporated by reference in its entirety. U.S. patent application Ser. No. 13/521,239 is a U.S. national phase application of PCT Application PCT/JP2011/006977, titled "ELASTIC WAVE DEVICE," filed on Dec. 14, 2011 which claims priority to Japanese Patent Application Serial No. 2010280146, filed on Dec. 16, 2010 and to Japanese Patent Application Serial No. 2011051194, filed on Mar. 9, 2011.

TECHNICAL FIELD

The present invention relates to elastic wave devices used in, e.g. mobile telecommunications apparatuses.

BACKGROUND ART

Figure 8:
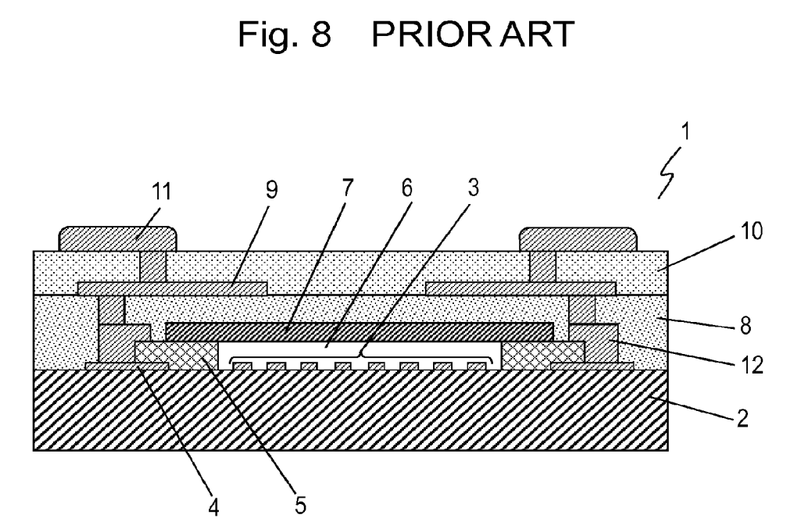
FIG. 8 is a schematic cross-sectional view of a conventional elastic wave device.

FIG. 8 is a schematic cross-sectional view of conventional elastic wave device 1. Elastic wave device 1 includes piezoelectric substrate 2, interdigital transducer (IDT) electrode 3 disposed on piezoelectric substrate 2, wiring electrode 4 disposed on piezoelectric substrate 2 and connected to IDT electrode 3, sidewall 5 disposed on piezoelectric substrate 2 to surround the circumference of IDT electrode 3, top plate 7 placed on sidewall 5 to cover space 6 above IDT electrode 3, insulator 8 covering sidewall 5 and top plate 7, inductor electrode 9 disposed on insulator 8, insulator 10 covering inductor electrode 9 and an upper surface of insulator 8, terminal electrode 11 disposed on insulator 10, and connecting electrode 12 passing through insulators 8 and 10 to electrically connect wiring electrode 4, inductor electrode 9, and terminal electrode 11.

An elastic wave device similar to conventional elastic wave device 1 is disclosed in Patent Literature 1.

The upper surface of insulator 8 is ground to have a constant height and to expose a surface of connecting electrode 12. Inductor electrode 9 is then formed on this surface to electrically connect connecting electrode 12 to inductor electrode 9.

Conventional elastic wave device 1 may decrease a Q-factor and an inductance of inductor electrode 9.

Figure 9:
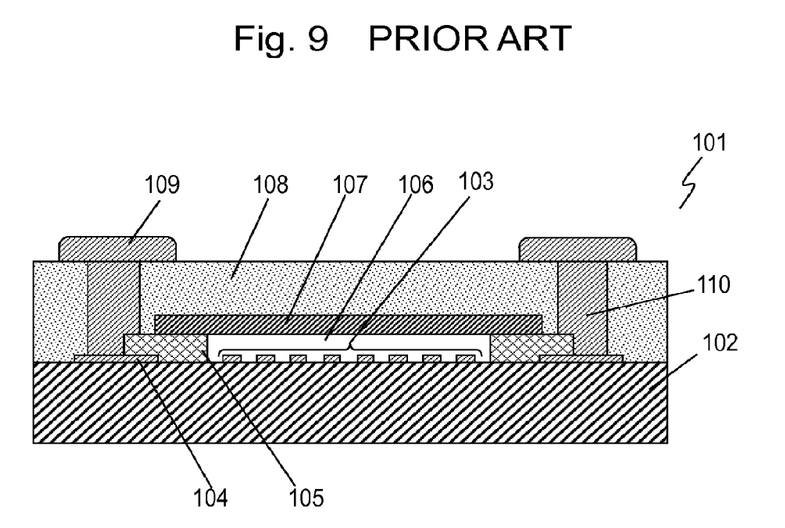
FIG. 9 is a schematic cross-sectional view of another conventional elastic wave device.

FIG. 9 is a schematic cross-sectional view of another conventional elastic wave device 101. Elastic wave device 101 includes piezoelectric substrate 102, IDT electrode 103 disposed on piezoelectric substrate 102, wiring electrode 104 disposed on piezoelectric substrate 102 and connected to IDT electrode 103, sidewall 105 disposed on piezoelectric substrate 102 to surround IDT electrode 103, top plate 107 placed on sidewall 105 to cover excitation space 106 above IDT electrode 103, insulator 108 covering sidewall 105 and top plate 107, terminal electrode 109 disposed on insulator 108, and connecting electrode 110 passing through insulator 108 to electrically connect wiring electrode 104 to terminal electrode 109.

Elastic wave device 101 may necessarily include an inductor having a certain inductance and a certain Q-factor in order to improve characteristics, such as an insertion loss, an out-of-band attenuation, and isolation. It is difficult to form a conductive trace functioning as the inductor having such characteristics on piezoelectric substrate 102. Elastic wave device 101 may be necessary to add a separate inductor besides elastic wave device 101 for composing an electronic apparatus.

CITATION LIST

Patent Literature

Patent Literature 1: Japanese Patent Laid-Open Publication No. 2009-10121

SUMMARY OF THE INVENTION

An elastic wave device includes a piezoelectric substrate, an IDT electrode disposed on the piezoelectric substrate, a wiring electrode disposed on the piezoelectric substrate and connected to the IDT electrode, a first insulator disposed on the piezoelectric substrate to seal the IDT electrode and the wiring electrode, a resin layer provided on the first insulator, an inductor electrode disposed on the resin layer, a second insulator disposed on the resin layer to cover the inductor electrode, a terminal electrode disposed on the second insulator, and a connecting electrode passing through the first insulator, the second insulator, and the resin layer to electrically connect the wiring electrode, the terminal electrode, and the inductor electrode. The first insulator includes a resin and filler dispersed in the resin. A density of filler in the resin layer is smaller than an average density of the filler in the first insulator.

This elastic wave device has excellent characteristics of the inductor while reducing variations of the characteristics.

DETAIL DESCRIPTION OF PREFERRED EMBODIMENTS

Exemplary Embodiment 1

Figure 1A:
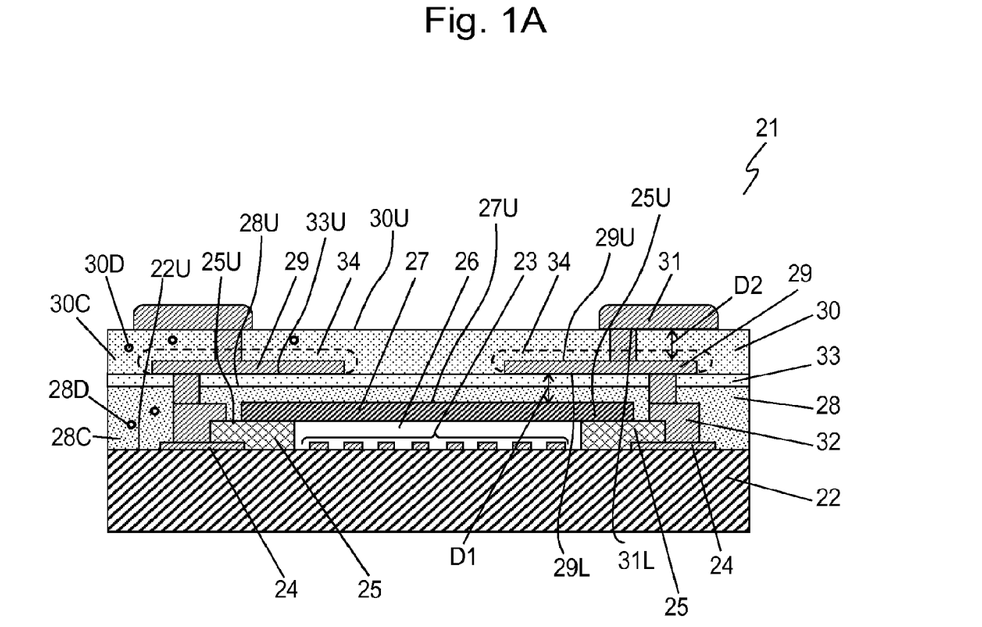
FIG. 1A is a schematic cross-sectional view of an elastic wave device according to Exemplary Embodiment 1 of the present invention.

FIG. 1A is a schematic cross-sectional view of elastic wave device 21 according to Exemplary Embodiment 1 of this invention. Elastic wave device 21 includes piezoelectric substrate 22, interdigital transducer (IDT) electrode 23 disposed on upper surface 22U of piezoelectric substrate 22, wiring electrodes 24 disposed on upper surface 22U of piezoelectric substrate 22, sidewall 25 formed on upper surface 22U of piezoelectric substrate 22, top plate electrode 27 provided on upper surface 25U of sidewall 25, insulator 28 covering sidewall 25 and top plate electrode 27, resin layer 33 disposed on upper surface 28U of insulator 28, inductor electrodes 29 disposed on upper surface 33U of resin layer 33, insulator 30 covering inductor electrodes 29 and upper surface 33U of resin layer 33, terminal electrodes 31 disposed on upper surface 30U of insulator 30, and connecting electrodes 32 passing through insulators 28 and 30 and resin layer 33. Wiring electrodes 24 are connected to IDT electrode 23. Sidewall 25 surrounds IDT electrode 23. Top plate electrode 27 covers space 26 above IDT electrode 23. Each of connecting electrodes 32 electrically connects respective one of wiring electrodes 24, respective one of inductor electrodes 29, and respective one of terminal electrodes 31. Resin layer 33 is provided between insulator 28 and inductor electrodes 29. A density of filler in resin layer 33 is smaller than a density of the filler in insulator 28.

Piezoelectric substrate 22 is a substrate made of monocrystal piezoelectric material, such as lithium tantalate, lithium niobate, or crystal.

A bonding layer of titanium is formed on upper surface 22U of piezoelectric substrate 22, and a metal film mainly including aluminum is formed on the bonding layer by sputtering. The metal film is then dry-etched to be patterned by a photolithographic method to form IDT electrode 23 and wiring electrode 24. IDT electrode 23 includes comb electrodes facing each other to excite an elastic wave on upper surface 22U of piezoelectric substrate 22. Wiring electrode 24 is a wiring trace connected to IDT electrode 23, thus constituting a circuit of elastic wave device 21.

Figure 1B:
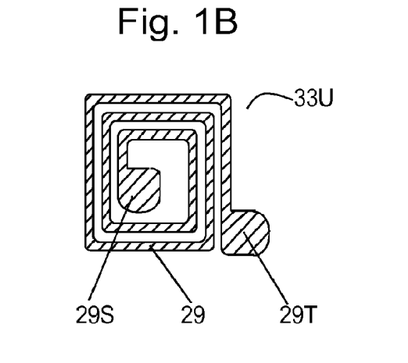
FIG. 1B is a plan view of a main portion of the elastic wave device shown in FIG. 1A.

FIG. 1B is a plan view of a main portion of elastic wave device 21, and particularly, is a plan view of inductor electrode 29. Inductor electrode 29 is made of a conductive strip which extends spirally and which is made of conductive material, such as metal, on upper surface 33U of resin layer 33. The conductive strip extends from end 29S to end 29T. End 29S is located on an outer side of the spiral shape. End 29T is located on an inner side of the spiral shape. End 29S is connected to wiring electrode 24. End 29T is connected to terminal electrode 31. Inductor electrode 29 according to Embodiment 1 has the spiral shape, but may having another shape, such as a meandering shape.

Sidewall 25 is formed by patterning photosensitive polyimide by a photolithography technique, and seals sides of space 26 allowing IDT electrode 23 to excite in space 26.

A conductive foil, such as a copper foil, is bonded onto upper surface 25U of sidewall 25 with an adhesive layer made of resin, and then, has its upper surface plated to form top plate electrode 27 metal. Top plate electrode 27 seals space 26 from above space 26 allowing IDT electrode 23 excite therein. Top plate electrode 27 and sidewall 25 thus covers IDT electrode 23.

Insulator 28 is made of thermosetting, epoxy resin to cover sidewall 25 and top plate electrode 27. Insulator 28 is cured, and then, an upper surface of insulator 28 is ground to shape insulator 28. This process of grinding exposes surfaces of connecting electrodes 32 flush with upper surface 28U of insulator 28 to allow connecting electrodes 32 to be readily connectable to inductor electrodes 29. Insulator 28 includes insulation resin 28C, such as the epoxy resin, and not less than 20 wt. % of filler 28D dispersed in the insulation resin. This material can ensure the physical strength sufficient to maintain space 26 for excitation of IDT electrode 23 while preventing moisture from entering into space 26. The filler to be included in insulator 28 can be a granular form of material, such as silica, mica, or alumina.

In order to forming resin layer 33, first, upper surface 28U of insulator 28 is coated by spin coating with an insulation resin, such as photosensitive epoxy resin which does not include filler. The coated insulation resin is exposed to light and cured to form resin layer 33 except for portions where connecting electrodes 32 passing through, by a photolithography to expose the portions of connecting electrodes 32. Resin layer 33 covers asperities of upper surface 28U of insulator 28, so that upper surface 33U of resin layer 33 becomes flat for inductor electrodes 29 to be formed. The flatness of upper surface 33U of resin layer 33 can smooth lower surfaces of inductor electrodes 29 formed thereon, and reduce resistances of inductor electrodes 29 to skin currents of high frequencies. This reduces a loss of electric energy, and improves characteristic of inductor electrodes 29 functioning as inductors. Resin layer 33 needs to be provided only on a base surface where inductor electrodes 29 are formed, and has a small thickness just sufficient to smooth the asperities of upper surface 28U of insulator 28. Resin layer 33 improves an electrical characteristic of inductor electrodes 29 at high frequencies since it does not contain filler. In general, since the filler generally has a specific dielectric constant higher than that of the resin, the filler accordingly increases a dielectric loss at high frequencies when added to the resin. Since resin layer 33 does not contain filler, resin layer 33 reduces a specific dielectric constant of the insulator around inductor electrodes 29, thereby reducing the dielectric loss and improving the electrical characteristic of inductor electrodes 29.

Inductor electrodes 29 are electrodes made of metal, such as copper, formed on upper surface 33U of resin layer 33 by photolithography, and function as inductors having inductances.

Insulator 30 covers inductor electrodes 29 and upper surface 33U of resin layer 33, and is made of photosensitive epoxy resin not containing filler. This resin is coated on inductor electrodes 29 upper surface 33U of resin layer 33 by spin coating, and then, is exposed to light to be cured by photolithography to form insulator 30 except for portions connecting electrodes 32 passing through. Insulator 30 includes resin 30C, and may include contain filler 30D dispersed in resin 30C. Filler 30D ensures the physical strength of insulator 30. In the case that elastic wave device 21 is used in a resin-molded configuration, such as transfer molding, particularly requiring a high molding pressure, inductor 30 may necessarily has a large physical strength in order to avoid a change in the characteristic of inductor electrodes 29 due to deformation of insulator 30 due to the molding pressure. In this case, not less than 20 wt. % of filler 30D may be included in insulator 30. Insulator 30 may have resin layer 34 containing substantially no filler 30D or a lower density of filler 30D than that of insulator 30 around inductor electrodes 29 so that resin layer 34 covers inductor electrodes 29. Resin layer 34 having substantially no filler 30D or of the lower density than that of insulator 30 can reduce dent marks formed in the surfaces of inductor electrodes 29 due to granular particles of filler 30D being pressed against the surfaces of inductor electrodes. This can ensure smoothness of the surfaces of inductor electrodes 29 and maintains excellent electrical characteristic of inductor electrodes 29 at high frequencies. In the case that resin layer 34 does not include filler 30D, the specific dielectric constant of the insulator decreases around inductor electrodes 29. This configuration reduces dielectric loss and improves the electrical characteristic of inductor electrodes 29. In the case that resin layer 34 includes filler 30D at a low density, the density of filler 30D in resin layer 34 is adjusted to be lower than a density of at least one of filler 28D of insulator 28 and filler 30D of insulator 30. In the case that resin layer 34 includes the low density of filler 30D, an average particle diameter of the filler to be included is ⅓ of a minimum gap between conductor traces of inductor electrodes 29. Such particle diameters can reduce an adverse influence of the filler on inductor electrodes 29, and maintain the superior characteristic as the inductors.

Terminal electrodes 31 are metallic electrodes formed on the surface of insulator 30, and function as an input-output terminal and a grounding terminal of elastic wave device 21.

Connecting electrodes 32 are metallic electrodes passing through insulators 28 and 30 and resin layer 33, and are formed by plating a metal, such as copper, for electrically connecting wiring electrodes 24, inductor electrodes 29, and terminal electrodes 31. The portions of connecting electrodes 32 that pass through insulator 28 are formed simultaneously when top plate electrode 27 is formed by plating, thereby simplifying the process of fabrication.

As described above, elastic wave device 21 according to Embodiment 1 includes resin layer 33 containing substantially no filler between insulator 28 and inductor electrodes 29. This structure smoothes upper surface 28U of insulator 28 by spreading resin layer 33 not containing filler over the asperities in upper surface 28U, and allows inductor electrodes 29 formed on smooth, upper surface 33U. It can thus achieve smoothness of the surfaces of inductor electrodes 29 that ensure excellent high frequency characteristic and reduce variations of the characteristics.

In conventional elastic wave device 1 shown in FIG. 8, the upper surface of insulator 8 is roughened due to grinding. Inductor electrodes 9 formed on the upper surface of insulator 8 tends to have a low Q-factor and a large variation of their inductances due to the ground surface.

Since insulator 28 contains filler 28D, the granular particles of filler 28D project on upper surface 28U of insulator 28. When resin layer 33 which do not containing filler is formed to fill spaces between the granular particles, resin layer 33 shares a part of filler 28D of insulator 28 in an area contacting insulator 28. Resin layer 33 may therefore be regarded as an insulator containing a density of filler smaller than the average density of the filler in insulator 28. In other words, resin layer 33 containing the filler of a smaller density than insulator 28 provided between insulator 28 and inductor electrodes 29 allows inductor electrodes 29 to be placed on very smooth upper surface 33U of resin layer 33. This smoothes the surfaces of inductor electrodes 29, and ensures excellent high frequency characteristic as the inductors. In the case that the thickness of resin layer 33 is larger than the average particle diameter of filler 28D of insulator 28, filler 28D projecting from insulator 28 can be covered positively with resin layer 33, and improve the high frequency characteristic of the inductors.

In addition, elastic wave device 21 according to Embodiment 1 may include resin layer 34 around inductor electrodes 29 where resin layer 34 covers inductor electrodes 29. Resin layer 34 is made of material containing substantially no filler or at a density lower than that of filler 28D of insulator 28 or filler 30D of insulator 30. This structure maintains smoothness of the surfaces of inductor electrodes 29 so as to ensure excellent high frequency characteristic while reducing variations of inductor electrodes 29.

In elastic wave device 21 according to Embodiment 1, resin layer 33 is made of photosensitive epoxy resin that does not contain filler. However, resin layer 33 can smoothes to the surfaces of inductor electrodes 29 even when it contains filler of a low density. The maximum particle diameter of the filler contained in resin layer 33 may be reduced to smooth the surfaces of inductor electrodes 29. However, resin layer 33 preferably does not contain filler in view of the smoothness in the surfaces of inductor electrodes Furthermore, elastic wave device 21 according to Embodiment 1 includes insulator 28 made of a resin containing filler 28D while insulator 28 can be made of insulation material other than resin material. The smoothness of the surfaces of inductor electrodes 29 is adversely affected by roughness of the surface of insulator 28 if inductor electrodes 29 are formed directly on upper surface 28U of insulator 28. Elastic wave device 21 according to Embodiment 1 ensures the smoothness of the surfaces of inductor electrodes 29 by providing resin layer 33 made of the resin not containing any filler between insulator 28 and inductor electrodes 29, thereby maintaining the excellent high frequency characteristic of inductor electrodes 29.

In the case that both of insulators 28 and 30 are made of resin materials containing fillers 28D and 30D, respectively, the adhesion between insulators 28 and 30 can be retained by providing any of resin layers 33 and 34 containing substantially no filler or a small density of filler over the entire surfaces between insulators 28 and 30.

Elastic wave device 21 according to Embodiment 1 is a surface acoustic wave filter having internal space 26 for exciting IDT electrode 23, but may be an elastic boundary-wave filter which does not have space 26, providing the same effects. In elastic wave device 21 having internal space 26 for exciting IDT electrode 23, however, filler 28D is included in resin 28C to form insulator 28 since elastic wave device 21 requires a physical strength to maintain the shape of space 26 while preventing moisture from entering into space 26. In this case, smoothness of the surfaces of inductor electrodes 29 is reduced when inductor electrodes 29 are formed directly on upper surface 28U of insulator 28. Resin layer 33 which does not contain filler is provided between upper surface 28U of insulator 28 and inductor electrodes 29 to secure the high frequency characteristic of inductor electrodes 29.

In elastic wave device 21 according to Embodiment 1, insulator 28 and resin layer 33 are formed by coating and during resin of liquid form, but may be formed by laminating sheets of uncured resin. In this case, a sheet resin of insulator 28 and another sheet resin of resin layer 33 are laminated to form both of insulator 28 and resin layer 33 simultaneously. Alternatively, insulator 28 and resin layer 33 may be formed by using a single resin sheet containing filler of a low density at one side facing inductor electrodes 29.

Figure 2A:
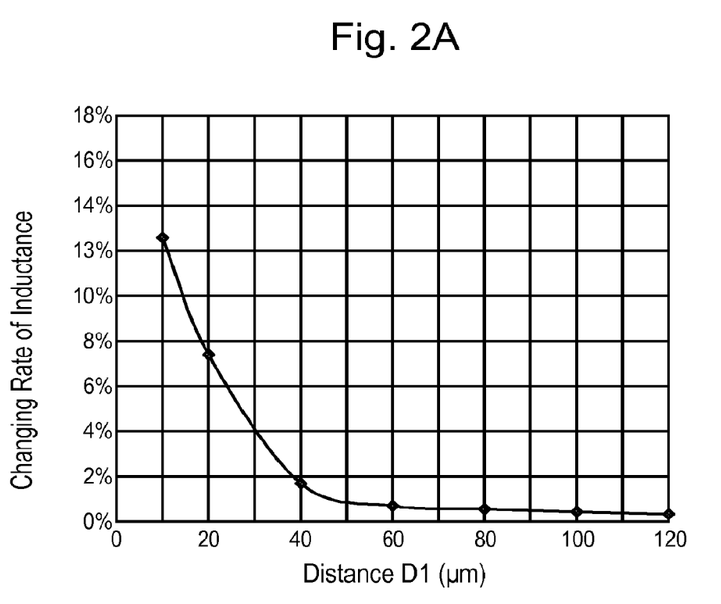
FIG. 2A shows a changing rate of an inductance of an inductor electrode of the elastic wave device according to Embodiment 1.
Figure 2B:
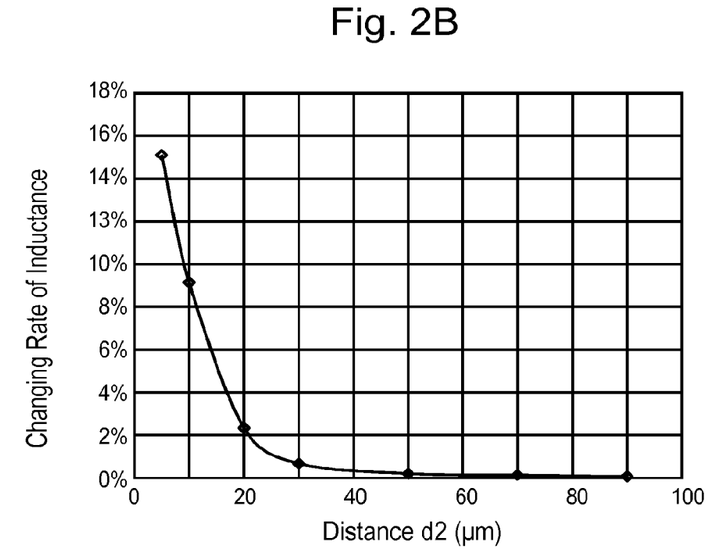
FIG. 2B shows a changing rate of the inductance of the inductor electrode of the elastic wave device according to Embodiment 1.

FIGS. 2A and 2B show changing rates of the inductance of inductor electrode 29 of elastic wave device 21 according to Embodiment 1. Samples of elastic wave device 21 were prepared in which upper surface 27U of top plate electrode 27 is located away from lower surface 29L of inductor electrode 29 by distance D1, and lower surface 31L of terminal electrode 31 is located away from upper surface 29U of inductor electrode 29 by distance D2. A pressure of 70 bars, which is equivalent to a molding pressure in the transfer molding, was applied to these samples. FIGS. 2A and 2B show changing rate at which the inductance of inductor electrode 29 after the pressure is applied changes from the inductance before the pressure is applied.

FIG. 2A shows a changing rate of the inductance of inductor electrode 29 when distance D1 changes from 10 μm to 120 μm with distance D2 unchanged. The changing rate of the inductance of inductor electrode 29 can be controlled to 10% or less by determining distance D1 to be not smaller than 15 μm. The changing rate of the inductance of inductor electrode 29 can be controlled further to 1% or less by determining distance D1 to be not smaller than 50 μm.

FIG. 2B shows a changing rate of the inductance of inductor electrode 29 when distance D2 is changed from 5 μm to 90 μm with distance D1 unchanged. The changing rate of the inductance of inductor electrode 29 can be controlled to 10% or less by determining distance D2 to be not smaller than 10 μm. The changing rate of the inductance of inductor electrode 29 can be controlled further to 1% or less by determining distance D2 to be not smaller than 30 μm.

The changing rate is reduced to 10% or less when inductor electrodes 29 disposed in elastic wave device 21 are used as inductors connected to a grounding circuit of a duplexer. In this case, distance D1 from upper surface 27U of top plate electrode 27 to lower surface 29L of inductor electrode 29 is set to be not smaller than 15 μm, and distance D2 from lower surface 31L of terminal electrode 31 to upper surface 29U of inductor electrode 29 is set to be not smaller than 10 μm. This structure can reduce variations of inductances of inductor electrodes 29 and obtain predetermined characteristics even if elastic wave device 21 is used in a resin-molded configuration, such as transfer molding, made with a high molding pressure.

Moreover, the variations of the inductances can be further reduced to 1% or less by determining distance D1 to be not smaller than 50 μm, and determining distance D2 to be not smaller than 30 μm, thereby providing the inductance characteristic accurately.

Exemplary Embodiment 2

Figure 3A:
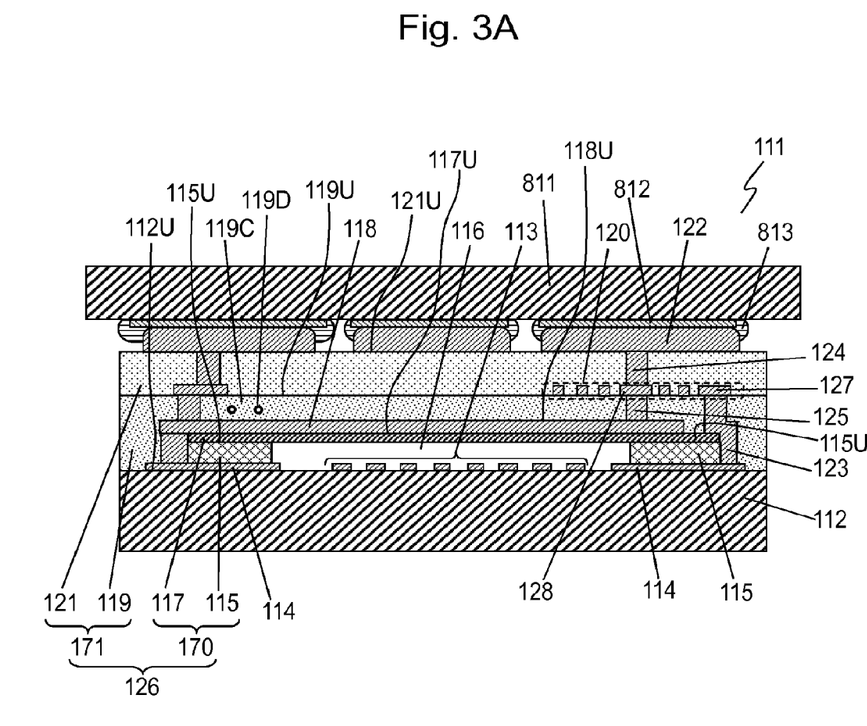
FIG. 3A is a schematic cross-sectional view of an elastic wave device according to Exemplary Embodiment 2 of the invention.

FIG. 3A is a schematic cross-sectional view of elastic wave device 111 according to Exemplary Embodiment 2 of this invention. Elastic wave device 111 includes piezoelectric substrate 112, interdigital transducer (IDT) electrodes 113 disposed on upper surface 112U of piezoelectric substrate 112, wiring electrodes 114 disposed on upper surface 112U of piezoelectric substrate 112, sidewall 115 formed on upper surface 112U of piezoelectric substrate 112, adhesive layer 117 provided on upper surface 115U of sidewall 115, top plate electrode 118 provided on upper surface 117U of adhesive layer 117, insulator 119 disposed on upper surface 112U of piezoelectric substrate 112, inductor electrode 120 disposed on upper surface 119U of insulator 119, insulator 121 disposed on upper surface 119U of insulator 119, terminal electrodes 122 disposed on upper surface 121U of insulator 121, connecting electrodes 123 passing through insulator 119, connecting electrodes 124 passing through insulator 121, and connecting electrodes 125 passing through insulator 119. Sidewall 115 surrounds IDT electrodes 113. Adhesive layer 117 covers excitation space 116 provided above IDT electrodes 113. Top plate electrode 118 is made of metal. Insulator 119 covers sidewall 115, adhesive layer 117, and top plate electrode 118. Insulator 121 covers insulator 119 and inductor electrode 120. Connecting electrode 123 connects wiring electrode 114 electrically to inductor electrode 120. Connecting electrode 124 connects inductor electrode 120 electrically to terminal electrode 122. Connecting electrode 125 connects inductor electrode 120 electrically to top plate electrode 118. Sidewall 115, adhesive layer 117, and insulators 119 and 121 constitute insulation body 126 that seals excitation space 116.

Figure 3B:
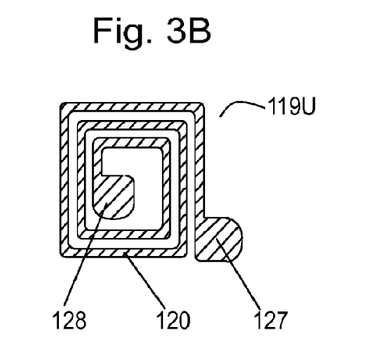
FIG. 3B is a plan view of a main portion of the elastic wave device shown in FIG. 3A.

FIG. 3B is a plan view of a main portion of elastic wave device 111, and particularly, is a plane view of inductor electrode 120. Inductor electrode 120 is made of a conductive strip which extends spirally and is made of conductive material, such as metal, on upper surface 119U of insulator 119. The conductive strip extends from end 127 to end 128. End 127 is located at an outer side of the spiral shape, and end 128 is located at an inner side of the spiral shape.

End 127 of inductor electrode 120 is connected to wiring electrode 114 via connecting electrode 123. End 128 of inductor electrode 120 is connected to terminal electrode 122 via connecting electrode 124, and is connected to top plate electrode 118 via connecting electrode 125.

Piezoelectric substrate 112 is a base substrate made of mono-crystal piezoelectric material, such as lithium tantalate, lithium niobate, or crystal.

IDT electrodes 113 and wiring electrodes 114 can be formed by disposing a metal film mainly containing aluminum via a bonding layer made of titanium on upper surface 112U of piezoelectric substrate 112 by sputtering. The metal film is then dry-etched to be patterned by a photolithographic method. IDT electrodes 113 including comb electrodes facing each other to excite an elastic wave on upper surface 112U of piezoelectric substrate 112. Wiring electrodes 114 are connected to IDT electrodes 113 to constitute a circuit of elastic wave device 111.

Sidewall 115 is made of a photosensitive polyimide by photolithography, and seals sides of excitation space 116 allowing IDT electrodes 113 to excite in space 116.

Adhesive layer 117 bonds top plate electrode 118 to upper surface 115U of sidewall 115 to seal above excitation space 116 allowing IDT electrodes 113 excite therein.

Top plate electrode 118 is formed by bonding a copper foil to upper surface 115U of sidewall 115 with adhesive layer 117, and electro-plating copper on an upper surface of the copper foil. Top plate electrode 118 increases the physical strength of adhesive layer 117 which seals excitation space 116 from above excitation space 116.

Connecting electrode 123 has a columnar shape formed by electro-plating copper on wiring electrode 114 simultaneously when top plate electrode 118 is formed by plating the copper. Connecting electrode 123 connects wiring electrode 114 electrically to inductor electrode 120.

Connecting electrode 125 has a columnar shape formed by electro-plating copper on upper surface 118U of top plate electrode 118. Connecting electrode 125 connects top plate electrode 118 electrically to inductor electrode 120.

A sheet of thermosetting epoxy resin is softened and laminated to cover sidewall 115, top plate electrode 118, and connecting electrode 123 formed on upper surface 112U of piezoelectric substrate 112, and than is cured. An upper surface of the cured epoxy resin is then ground to allow the resin to have a predetermined shape, providing insulator 119. This process of grinding also exposes the upper surfaces of connecting electrodes 123 and 125 flush with upper surface 119U of insulator 119 to allow connecting electrodes 123 and 125 to be readily connectable to inductor electrode 120. Insulator 119 contains resin 119C, such as epoxy resin, and filler 119D made granular insulation material, such as silica, mica, or alumina, dispersed in resin 119C to provide the physical strength necessary to maintain excitation space 116 where IDT electrodes 113 excite and to prevent moisture from entering into space 116. Insulator 119 can be formed by coating and curing an epoxy resin of liquid form, and shaping its upper surface by grinding.

Inductor electrode 120 is made of a metal, such as copper, formed on upper surface 119U of insulator 119 by photolithography, and functions as an inductor having an inductance.

Insulator 121 is made of a photosensitive epoxy resin covering insulator 119 and inductor electrode 120, and does not containing filler. This resin of liquid form is coated by spin coating, exposed to light and cured by photolithography to form insulator 119 except for a portion which connecting electrode 124 passes through.

Connecting electrode 124 is an electrode made of metal having a columnar shape formed by electro-plating metal, such as copper, to penetrate through insulator 121. Connecting electrode 124 connects inductor electrode 120 electrically to terminal electrode 122.

Terminal electrodes 122 are electrodes made of formed on upper surface 121U of insulator 121, and function as input-output terminals and a grounding terminal of elastic wave device 111.

In elastic wave device 111, an arrangement of IDT electrodes 113 on piezoelectric substrate 112 generally restricts positions of connecting electrodes 123 connected to wiring electrodes 114, hence tending to position connecting electrodes 123 on a periphery of upper surface 112U of piezoelectric substrate 112. Terminal electrodes 122 having a large area reduce the restriction on the position of connecting electrodes 124 connected to terminal electrodes 122.

In elastic wave device 111 according to Embodiment 2, end 127 of inductor electrode 120 is connected to wiring electrode 114 via connecting electrode 123. End 128 of inductor electrode 120 is connected to terminal electrode 122 via connecting electrode 124. This connection minimizes a length of wiring paths for connecting inductor electrode 120. This structure makes additional wiring unnecessary, thereby providing elastic wave device 111 with a small size and a low resistance loss.

As described above, elastic wave device 111 according to Embodiment 2 includes piezoelectric substrate 112, IDT electrodes 113 disposed on piezoelectric substrate 112, wiring electrodes 114 disposed on piezoelectric substrate 112 and connected to IDT electrodes 113, insulators 119 and 121 that seal IDT electrodes 113 and wiring electrodes 114 on piezoelectric substrate 112, inductor electrode 120 embedded in insulation body 126, and terminal electrodes 122 disposed on insulation body 126. End 127 of inductor electrode 120 is connected with wiring electrode 114 via connecting electrode 123. End 128 of inductor electrode 120 is connected to terminal electrode 122 via connecting electrode 124.

The above structure minimizes the length of wiring paths for connecting inductor electrodes 120, hence providing elastic wave device 111 with a small size. The structure can also reduce the resistance loss since it does not require additional wiring for connection of inductor electrodes 120, thereby providing excellent inductance characteristic of inductor electrodes 120.

In particular, end 128 of inductor electrode 120 is positioned directly under terminal electrode 122. This structure can minimize a wiring length of connecting electrode 124 that connects end 128 of inductor electrode 120 to terminal electrode 122, and minimize the resistance loss due to connecting electrode 124.

In addition, end 127 of inductor electrode 120 is positioned directly above wiring electrode 114. This structure can minimize a wiring length of connecting electrode 123 that connects end 127 of inductor electrode 120 to wiring electrode 114 on piezoelectric substrate 112, and minimize the resistance loss due to connecting electrode 123.

Moreover, elastic wave device 111 according to Embodiment 2 includes piezoelectric substrate 112, IDT electrodes 113 disposed on piezoelectric substrate 112, wiring electrodes 114 disposed on piezoelectric substrate 112 and connected to IDT electrodes 113, insulation body 126 that seals IDT electrodes 113 and wiring electrodes 114 on piezoelectric substrate 112, inductor electrode 120 embedded inside insulation body 126, terminal electrodes 122 disposed on insulation body 126, connecting electrode 123 embedded inside insulation body 126 to connect wiring electrode 114 to inductor electrodes 120, and connecting electrode 124 connecting inductor electrode 120 to terminal electrode 122. Inductor electrode 120 is entirely fit into an area directly below terminal electrode 122 and inside a space covered by an outer periphery of terminal electrode 122 in viewing from above.

Since terminal electrode 122 covers inductor electrode 120, terminal electrode 122 prevents inductor electrode 120 from deforming due to an external force, and avoids changes in the inductor characteristic. In the case that an external force is applied to elastic wave device 111, if insulation body 126 covering excitation space 116 is deformed toward excitation space 116 allowing IDT electrodes 113 to excite, the inductor characteristic changes due to the deformation of inductor electrode 120 inside insulation body 126.

When elastic wave device 111 is molded into a resin particularly by transfer molding after being mounted onto mother board 811 together with other electronic components, elastic wave device 111 is subjected to very severe conditions, such as a temperature ranging from 170 to 180° C. and a pressure ranging from 50 to 100 atm, which is required for the transfer molding. Insulation body 126 deforms largely under this condition, and accordingly, deforms the shape of inductor electrode 120 disposed inside insulation body 126, thereby resulting in a substantial change in the characteristic of the inductor. Insulation body 126 made of resin material increases severity of the deformation.

The deformation of insulation body 126 due to the molding pressure of the resin becomes greater when inductor electrode 120 is positioned directly above excitation space 116, as shown in FIG. 3A. This position has inductor electrode 120 avoid to be positioned directly above excitation space 116, thus restricting an area where inductor electrode 120 can be formed.

Elastic wave device 111 is configured to be mounted onto external mother board 811 having mounting electrodes 812 thereon. Terminal electrodes 122 are configured to be bonded to mounting electrodes 812 with conductive adhesive 813, such as a solder. Upon being reinforced by mother board 811 and conductive adhesive 813, terminal electrodes 122 is prevented from deforming due to an external force, and reduces the effect of molding pressure even when elastic wave device 111 is transfer-molded after mounted.

Elastic wave device 111 according to Embodiment 2 includes terminal electrode 122 provided directly above inductor electrode 120 to cover inductor electrode 120. This structure reduces the effect of the external force on inductor electrode 120 even when elastic wave device 111 is molded in a resin after mounted, thereby reducing a change in the inductor characteristic considerably, and stabilizing the electrical characteristic of elastic wave device 111.

This structure also reduces the limitation on the area where inductor electrode 120 is formed within piezoelectric substrate 112, and provides a larger inductance without increasing a number of layers on which inductor electrodes 120 are formed. This provides elastic wave device 111 with a small size and a low profile even if inductors are built therein.

In addition, elastic wave device 111 according to Embodiment 2 includes top plate electrode 118 formed inside insulation body 126 to cover excitation space 116 from above, and connecting electrode 125 connecting top plate electrode 118 to end 128 of inductor electrode 120. This structure can reduce an adverse influence on the electrical characteristic of inductor electrode 120 due to the external force. In other words, top plate electrode 118 covering excitation space 116 from above can secure the physical strength of a portion under inductor electrode 120. Connecting electrode 125 connecting top plate electrode 118 to end 128 of inductor electrode 120 can mechanically reinforce the position of inductor electrode 120. This structure can further reduce deformation of inductor electrode 120 and avoid the change in the electrical characteristic of inductor electrode 120 even when a large external force is applied to elastic wave device 111 upon molding elastic wave device 111 into a resin.

In elastic wave device 111 according to Embodiment 2, sidewall 115 and adhesive layer 117 constitute top cover 170 covering excitation space 116, and insulators 119 and 121 constitute sealing body 171 that seals top cover 170 above upper surface 112U of piezoelectric substrate 112. Top cover 170 and sealing body 171 constitute insulation body 126. Since elastic wave device 111 includes connecting electrode 123 located outside of top cover 170, connecting electrode 123 is not needed to penetrate through top cover 170, thus simplifying the processes for manufacturing elastic wave device 111. This structure also shortens wiring connection between end 127 of inductor electrode 120 and connecting electrode 123, hence providing elastic wave device 111 with a small size and reducing undesired electromagnetic interaction.

In addition, the above structure can minimize the length of wiring path for connecting inductor electrode 120, and it can hence reduce a resistance loss since it does not require additional wiring for connection. Thus, elastic wave device 111 having a small size having a surface area substantially equal to that of piezoelectric substrate 112 provides inductor electrode 120 with an excellent inductance characteristic.

Inductor electrode 120 according to Embodiment 2 is has a spiral shape, but may have other shapes, such as a meandering shape. Terminal electrode 122 to be soldered to mother board 811 is located directly above inductor electrode 120 to cover inductor electrode 120 directly above excitation space 116. This structure provides elastic wave devices 111 with small changes in characteristics against external forces.

Exemplary Embodiment 3

Figure 4:
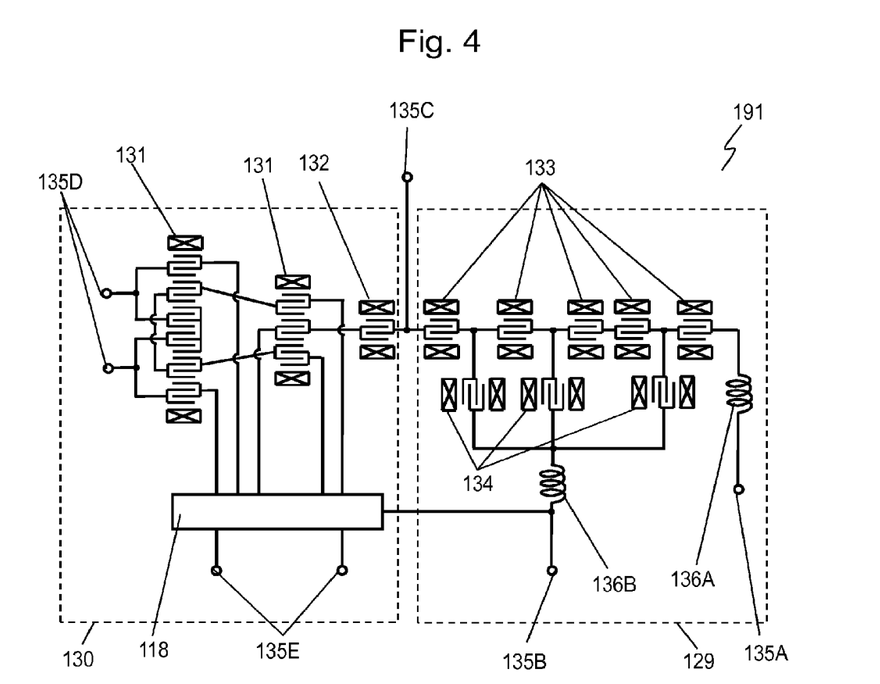
FIG. 4 is a circuit diagram of an elastic wave device according to Exemplary Embodiment 3 of the invention.
Figure 5:
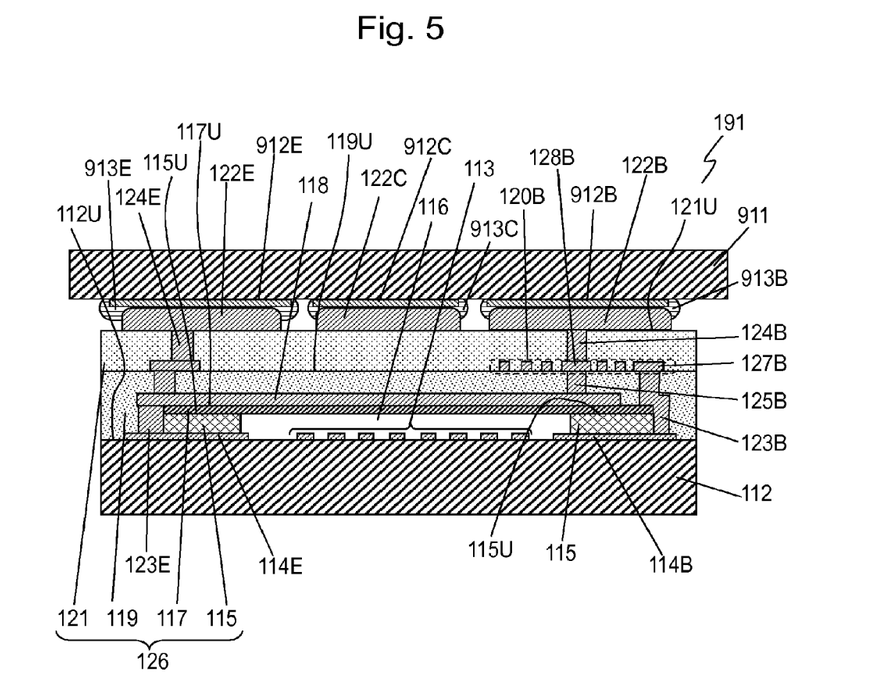
FIG. 5 is a schematic cross-sectional view of the elastic wave device according to Embodiment 3.

FIG. 4 is a circuit diagram of elastic wave device 191 according to Exemplary Embodiment 3 of this invention. FIG. 5 is a schematic cross-sectional view of elastic wave device 191. In figures, such as FIGS. 4 and 5, illustrating the device according to Embodiment 3, components identical to those of elastic wave device 111 according to Embodiment 2 shown in FIG. 3A are dented by the same reference numerals.

As shown in FIG. 4, elastic wave device 191 is a duplexer including transmitting filter 129 and receiving filter 130. Input-output terminals of transmitting filter 129 include unbalanced transmitting-side signal terminal 135A, transmitting-side grounding terminal 135B and antenna terminal 135C. Input-output terminals of receiving filter 130 include balanced receiving-side signal terminals 135D, receiving-side grounding terminals 135E and antenna terminal 135C. Receiving filter 130 includes two longitudinally coupled resonator type elastic wave filters 131 and one one-terminal pair elastic wave resonator 132 that are connected in series along a signal path. Grounding paths of longitudinally coupled resonator type elastic wave filters 131 are connected to receiving-side grounding terminal 135E via top plate electrode 118. Transmitting filter 129 includes series arm resonators 133 and parallel arm resonators 134 which are one-terminal pair elastic wave resonators. That is, transmitting filter 129 includes a ladder type circuit including five series arm resonators 133 connected in series along the signal path and three parallel arm resonators 134 each connected between the signal path and the grounding path. Inductor 136A is connected in series between one of series arm resonators 133 closest to transmitting-side signal terminal 135A and transmitting-side signal terminal 135A. Inductor 136B is connected between grounding sides of three parallel arm resonators 134 and transmitting-side grounding terminal 135B. Transmitting-side grounding terminal 135B is connected to top plate electrode 118.

As shown in FIG. 5, elastic wave device 191 includes piezoelectric substrate 112, plural IDT electrodes 113 disposed on upper surface 112U of piezoelectric substrate 112, wiring electrodes 114B and 114E disposed on upper surface 112U of piezoelectric substrate 112, sidewall 115 formed on upper surface 112U of piezoelectric substrate 112, adhesive layer 117 provided on upper surface 115U of sidewall 115, top plate electrode 118 provided on upper surface 117U of adhesive layer 117, insulator 119 disposed on upper surface 112U of piezoelectric substrate 112, inductor electrode 120B disposed on upper surface 119U of insulator 119, insulator 121 disposed on upper surface 119U of insulator 119, and terminal electrodes 122B, 122C, and 122E disposed on upper surface 121U of insulator 121. Wiring electrodes 114B and 114E are connected with IDT electrodes 113. Sidewall 115 surrounds IDT electrodes 113. Adhesive layer 117 covers excitation space 116 provided on IDT electrodes 113. Top plate electrode 118 is made of a metal. Insulator 119 covers sidewall 115, adhesive layer 117, and top plate electrode 118. Connecting electrode 123B passes through insulator 119, and electrically connects wiring electrode 114B to end 127B of inductor electrode 120B. Connecting electrodes 124B passes through insulator 121, and electrically connects end 128B of inductor electrode 120B to terminal electrode 122B. Connecting electrode 125B passes through insulator 119, and electrically connects end 128B of inductor electrode 120B to top plate electrode 118. Connecting electrode 123E passes through insulator 119, and connects wiring electrode 114E to top plate electrode 118. Connecting electrode 124E passes through insulator 121, and connects top plate electrode 118 to terminal electrode 122E. Sidewall 115, adhesive layer 117, and insulators 119 and 121 constitute insulation body 126 that seals excitation space 116.

Figure 6:
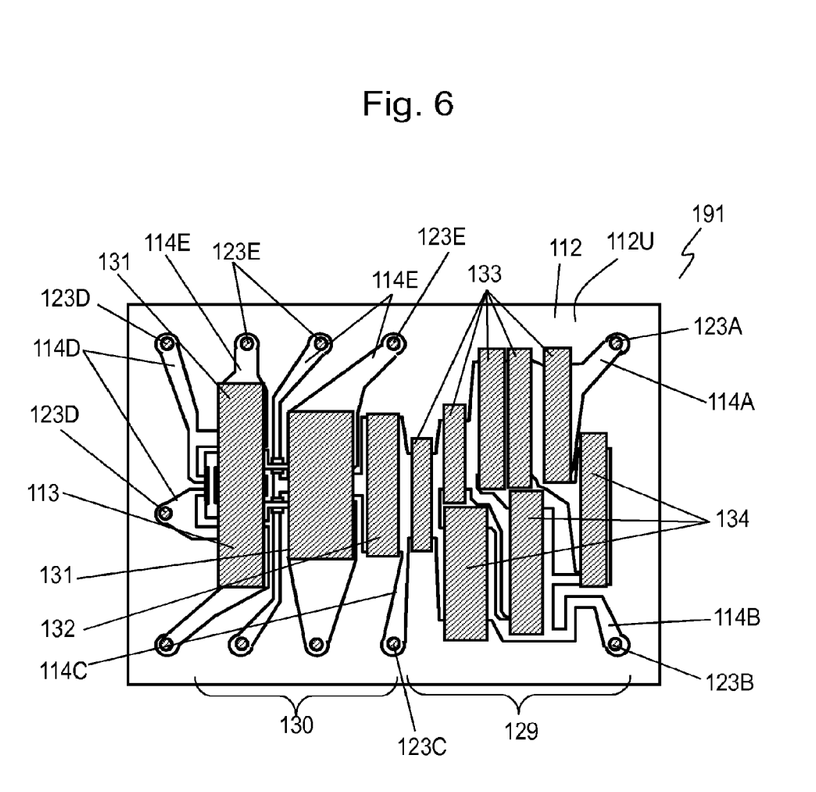
FIG. 6 is a plan view of the elastic wave device according to Embodiment 3.

FIG. 6 is a plan view of piezoelectric substrate 112 of elastic wave device 191. Elastic wave device 191 includes transmitting filter 129 and receiving filter 130 both disposed on upper surface 112U of piezoelectric substrate 112. Receiving filter 130 includes two longitudinally coupled resonator type elastic wave filters 131 and one one-terminal pair elastic wave resonator 132 that are connected in series. Transmitting filter 129 includes a ladder type circuit including five series arm resonators 133 connected in series along the signal path and three parallel arm resonators 134 each connected between the signal path and the grounding path. Series arm resonators 133 and parallel arm resonators 134 are one-terminal pair elastic wave resonators. Wiring electrode 114A is an input-side wiring conductor of transmitting filter 129, and is connected to connecting electrode 123A. Wiring electrode 114B is a ground wiring of transmitting filter 129, and is connected to connecting electrode 123B. Wiring electrode 114C is a common wiring conductor of both transmitting filter 129 and receiving filter 130, and is connected to connecting electrode 123C. Wiring electrode 114D is an output-side wiring conductor of receiving filter 130, and is connected to connecting electrode 123D. Wiring electrodes 114E are ground wirings of receiving filter 130, and are connected to connecting electrode 123E.

Figure 7A:
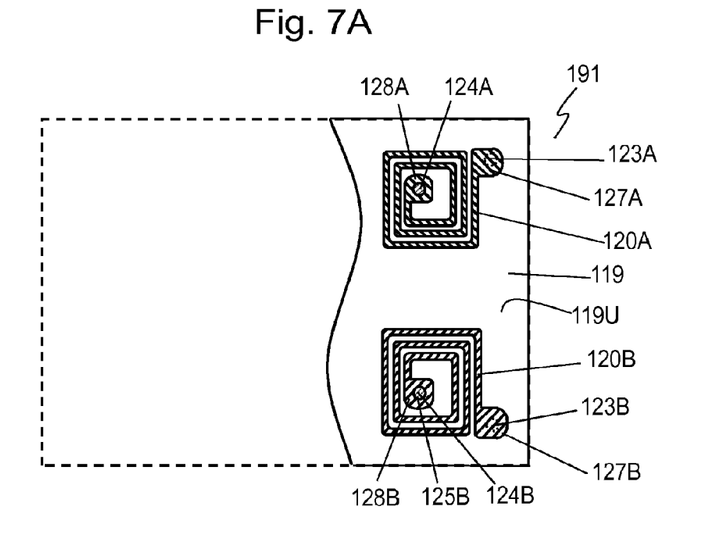
FIG. 7A is a plan view of a main portion of the elastic wave device according to Embodiment 3.

FIG. 7A is a plan view of a main portion of elastic wave device 191. Inductor electrodes 120A and 120B are disposed on upper surface 119U of insulator 119. Inductor electrode 120A is made of a conductive strip extending spirally made of conductive material, such as a metal, on upper surface 119U of insulator 119. The conductive strip extends from end 127A to end 128A. End 127A is located at an outer side of the spiral shape, and end 128A is located at an inner side of the spiral shape. Inductor electrode 120B is made of a conductive strip extending spirally made of conductive material, such as a metal, on upper surface 119U of insulator 119. The conductive strip extends from end 127B to end 128B. End 127B is located at an outer side of the spiral shape, and end 128B is located at an inner side of the spiral shape. Inductor electrodes 120A and 120B function as inductors that have inductances. More specifically, inductor electrode 120A constitutes inductor 136A shown in FIG. 4. Connecting electrode 123A is connected to a lower surface of end 127A of inductor electrode 120A. Connecting electrode 124A is connected to an upper surface of end 128A of inductor electrode 120A. Inductor electrode 120B constitutes inductor 136B shown in FIG. 4. Connecting electrode 123B is connected to a lower surface of end 127B of inductor electrode 120B. Connecting electrode 124B is connected to an upper surface of end 128B of inductor electrode 120B. Connecting electrode 125B is connected to a lower surface of end 128B of inductor electrode 120B.

Figure 7B:
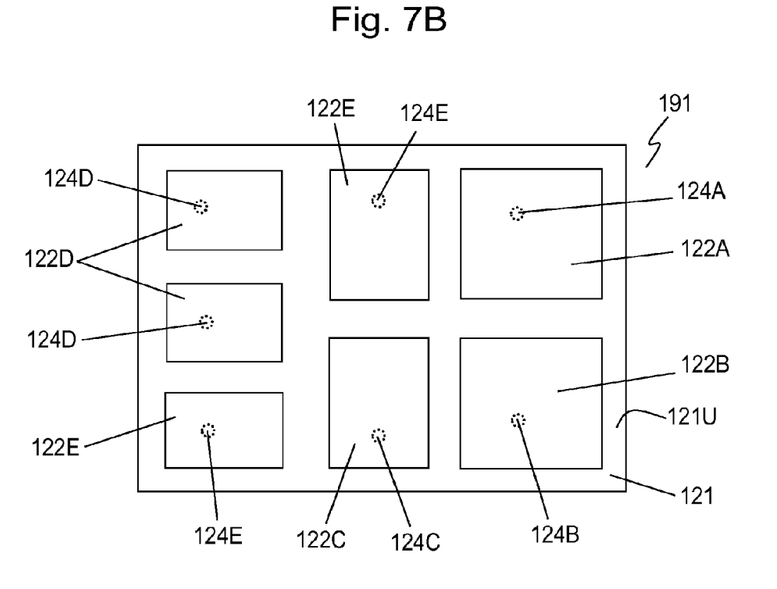
FIG. 7B is a plan view of a main portion of the elastic wave device according to Embodiment 3.

FIG. 7B is a plan view of a main portion of elastic wave device 191. Terminal electrodes 122A, 122B, 122C, 122D and 122E are disposed on upper surface 121U of insulator 121. Terminal electrode 122A constitutes transmitting-side signal terminal 135A shown in FIG. 4. Terminal electrode 122B constitutes transmitting-side grounding terminal 135B shown in FIG. 4. Terminal electrode 122C constitutes antenna terminal 135C shown in FIG. 4. Terminal electrode 122D constitutes receiving-side signal terminal 135D shown in FIG. 4. Terminal electrode 122E constitutes receiving-side grounding terminal 135E also shown in FIG. 4. Connecting electrode 124A is connected to a lower surface of terminal electrode 122A so that terminal electrode 122A is connected via inductor electrode 120A and connecting electrode 123A to wiring electrode 114A, which is the input side wiring conductor of transmitting filter 129. Connecting electrode 124B is connected to a lower surface of terminal electrode 122B. Terminal electrode 122B is connected via inductor electrode 120B and connecting electrode 123B to wiring electrode 114B, which is the ground wiring of transmitting filter 129. Terminal electrode 122B is also connected to top plate electrode 118 via connecting electrode 124B, terminal 128B of inductor electrode 120B, and connecting electrode 125B. Connecting electrode 124C is connected to a lower surface of terminal electrode 122C. Terminal electrode 122C is connected via connecting electrode 123C to wiring electrode 114C, which is the common wiring conductor of transmitting filter 129 and receiving filter 130. Connecting electrode 124D is connected to a lower surface of terminal electrode 122D. Terminal electrode 122D is connected via connecting electrode 123D to wiring electrode 114D, which is the output side wiring conductor of receiving filter 130. Connecting electrode 124E is connected to a lower surface of terminal electrode 122E so that terminal electrode 122E is connected via top plate electrode 118 and connecting electrode 123E to wiring electrode 114E, which is the grounding side conductor of receiving filter 130.

In elastic wave device 191 according to Embodiment 3, the ladder type elastic wave filter is formed on upper surface 112U of piezoelectric substrate 112, as illustrated above. Inductor electrode 120B is connected between parallel arm resonators 134 of the ladder type elastic wave filter and transmitting-side grounding terminal 135B. Thus, the ladder type filter circuit having inductor 136B connected to parallel arm resonators 134 can be arranged in elastic wave device 191 having a small size.

In this ladder type elastic wave filter, an attenuation pole at a low-frequency side shifts when the inductance of inductor 136B connected between parallel arm resonators 134 and transmitting-side grounding terminal 135B changes. This significantly influences the filtering characteristic. Inductor electrodes 120A and 120B, in particular, are located directly above IDT electrodes 113 of series arm resonators 133 and parallel arm resonators 134. Upon receiving an external force, insulators 119 and 121 deform toward excitation space 116, and affect inductor electrodes 120A and 120B considerably. Inductor electrode 120B located directly above IDT electrode 113 is positioned directly under terminal electrode 122B for transmitting-side grounding terminal 135B such that inductor electrode 120B is fit inside an area covered by an outer periphery of terminal electrode 122B in view from above, as shown in FIGS. 5, 7A, and 7B.

Elastic wave device 191 is configured to be mounted to external mother board 911, as illustrated in FIG. 5. Mother board 911 has mounting electrodes 912B, 912C, and 912E thereon. Terminal electrode 122B is configured to be bonded to mounting electrodes 912B with conductive adhesive 913B, such as a solder. Being reinforced by mother board 911 and conductive adhesive 913B, terminal electrode 122B is prevented from deforming due to an external stress. This structure reduces deformation of inductor electrode 120B due to the external force, stabilizes the inductance, and provides the ladder type elastic wave filter with stable filtering characteristics. Similarly, terminal electrodes 122C and 122E are configured to be fixed to mounting electrodes 912C and 912E with conductive adhesives 913C and 913E, such as solders, respectively. Being reinforced by mother board 911 and conductive adhesives 913C and 913E, terminal electrodes 122C and 122E is prevented from deforming due to the external stress. Thus, deformation of elastic wave device 191 is reduced, stabilizing its characteristics.

Elastic wave device 191 forms the ladder type filter circuit on piezoelectric substrate 112. Inductor electrode 120A is connected between series arm resonator 133 and transmitting-side signal terminal 135A of the ladder type filter circuit. This configuration provides the ladder type filter circuit having inductor 136A connected in series to series arm resonator 133 within small-sized elastic wave device 191.

Elastic wave device 191 according to Embodiment 3 includes receiving filter 130 and transmitting filter 129 including the ladder type circuit. Wiring electrode 114E at the ground side of receiving filter 130 is connected to terminal electrode 122E of receiving-side grounding terminal 135E via top plate electrode 118. Wiring electrode 114B at the ground side of parallel arm resonators 134 of transmitting filter 129 is connected to end 127B of inductor electrode 120B via connecting electrode 123B. End 128B of inductor electrode 120B is connected to terminal electrode 122B of transmitting-side grounding terminal 135B via connecting electrode 124B. Connecting electrode 125B connects top plate electrode 118 to end 128B of inductor electrode 120B.

Top plate electrode 118 is used as a common grounding electrode of the receiving side. Top plate electrode 118 is connected to grounding terminal 135B of the transmitting side via connecting electrode 125B. This enhances the transmitting-side and receiving-side grounding, improving isolation between transmitting filter 129 and receiving filter 130, thereby providing the duplexer with excellent characteristics.

In Embodiments 1 to 3, terms indicating directions, such as "upper surface", "lower surface2, "directly above2, and "directly under", indicate relative directions depending only on relative positions of components, such as the piezoelectric substrate and the IDT electrodes, of the elastic wave device, and doe not indicate absolute directions, such as a vertical direction.

INDUSTRIAL APPLICABILITY

An elastic wave device according to the present invention ensure excellent high-frequency electrical characteristics of built-in inductors in spite of their extremely small size, and are therefore useful as elastic wave devices used mainly for mobile telecommunications apparatuses.

REFERENCE MARKS IN THE DRAWINGS

21 Elastic Wave Device
22 Piezoelectric Substrate
23 IDT Electrode
24 Wiring Electrode
25 Sidewall
26 Space
27 Top Plate Electrode
28 Insulator (First Insulator)
28C Resin (First Resin)
28D Filler (First Filler)
29 Inductor Electrode
30 Insulator (Second Insulator)
30C Resin (Second Resin)
30D Filler (Second Filler)
31 Terminal Electrode
32 Connecting Electrode
33 Resin Layer (First Resin Layer)
34 Resin Layer (Second Resin Layer)
111, 191 Elastic Wave Device
112 Piezoelectric Substrate
113 IDT Electrode (First IDT Electrode, Second IDT Electrode)
114, 114A, 114B, 114C, 114D, 114E Wiring Electrode
116 Excitation Space
118 Top Plate Electrode
119 Insulator (First Insulator)
120, 120A, 120B Inductor Electrode
121 Insulator (Second Insulator)
122, 122A, 122B, 122C, 122D, 122E Terminal Electrode (First Terminal Electrode, Second Terminal Electrode)
123, 123A, 123B Connecting Electrode (First Connecting Electrode)
124, 124A, 124B Connecting Electrode (Second Connecting Electrode)
125, 125B Connecting Electrode (Third Connecting Electrode)
126 Insulation Body
127, 127A, 127B End (First End)
128, 128A, 128B End (Second End)
129 Transmitting Filter
130 Receiving Filter
134 Parallel Arm Resonator
170 Top Cover
171 Sealing Body

What is claimed is:

1. An elastic wave device comprising:
a piezoelectric substrate;
an interdigital transducer (IDT) electrode disposed on an upper surface of the piezoelectric substrate;
a wiring electrode disposed on the upper surface of the piezoelectric substrate and connected to the IDT electrode;
a first insulator layer disposed on the upper surface of the piezoelectric substrate, the first insulator layer sealing the IDT electrode and the wiring electrode, the first insulator layer including a first resin and a first filler dispersed in the first resin;
a resin layer, distinct from the first insulator layer, provided on an upper surface of the first insulator layer, the resin layer including no filler;
an inductor electrode disposed on an upper surface of the resin layer;
a second insulator layer disposed on the upper surface of the resin layer, the second insulator covering the inductor electrode;
a terminal electrode disposed on an upper surface of the second insulator layer; and
a connecting electrode passing through the first insulator layer, the second insulator layer, and the resin layer, the connecting electrode electrically connecting the wiring electrode, the terminal electrode, and the inductor electrode.

2. The elastic wave device of claim 1 wherein the second insulator layer includes a second resin and a second filler dispersed in the second resin, a density of the second filler included in the second insulator layer in a region disposed around the inductor electrode being less than an average density of the first filler in the first insulator layer and less than a density of the second filler included in the second insulator layer in regions other than the region disposed around the inductor electrode.

3. The elastic wave device of claim 2 wherein the second insulator layer has a lower dielectric constant in the region disposed around the inductor electrode than in the regions other than the region disposed around the inductor electrode.

4. The elastic wave device of claim 1 further comprising a top plate electrode disposed in the first insulator layer, the top plate electrode disposed above the IDT electrode, a distance from an upper surface of the top plate electrode to a lower surface of the inductor electrode being not smaller than 15 μm.

5. The elastic wave device of claim 4 wherein a distance from a lower surface of the terminal electrode to an upper surface of the inductor electrode is not smaller than 10 μm.

6. The elastic wave device of claim 1 wherein a distance from a lower surface of the terminal electrode to an upper surface of the inductor electrode is not smaller than 10 μm.

7. The elastic wave device of claim 1 wherein the resin layer has a thickness larger than an average particle diameter of the first filler in the first insulator layer.

8. The elastic wave device of claim 1 further comprising a top plate electrode disposed in the first insulator layer, the top plate electrode disposed above the IDT electrode, a distance from an upper surface of the top plate electrode to a lower surface of the inductor electrode being not smaller than 50 µm.

9. The elastic wave device of claim 8 wherein a distance from a lower surface of the terminal electrode to an upper surface of the inductor electrode is not smaller than 30 µm.

10. The elastic wave device of claim 1 wherein an average density of the first filler in the first insulator layer is not less than 20 percent by weight.

11. The elastic wave device of claim 1 wherein the resin layer has a lower dielectric constant than the first insulator layer.

12. An elastic wave device comprising:
a piezoelectric substrate;
an interdigital transducer (IDT) electrode disposed on an upper surface of the piezoelectric substrate;
an insulator layer disposed on the upper surface of the piezoelectric substrate, the insulator layer sealing the IDT electrode, the insulator layer including a resin and a filler dispersed in the resin;
a resin layer, distinct from the insulator layer, disposed on an upper surface of the insulator layer, the resin layer including no filler;
a first terminal electrode disposed on an upper surface of the resin layer;
an inductor electrode disposed on the insulator layer and covered by the resin layer, the inductor electrode being located directly under the first terminal electrode and occupying an area inside an outer periphery of the first terminal electrode, the inductor electrode having a first end in electrical communication with the IDT electrode and a second end in electrical communication with the first terminal electrode.

13. The elastic wave device of claim 12 further comprising an excitation space provided on an upper surface of the IDT electrode, the insulator layer sealing the excitation space.

14. The elastic wave device of claim 13 further comprising a top cover covering the excitation space, the insulator layer sealing the top cover.

15. The elastic wave device of claim 12 wherein the inductor electrode has a spiral shape, the first end of the inductor electrode being located at an outer side of the spiral shape, the second end of the inductor electrode being located at an inner side of the spiral shape.

16. The elastic wave device of claim 12 further comprising a wiring electrode providing electrical communication between the first end of the inductor electrode and the IDT electrode, the first end of the inductor electrode being disposed directly above the wiring electrode.

17. An elastic wave device comprising:
a piezoelectric substrate;
an interdigital transducer (IDT) electrode disposed on an upper surface of the piezoelectric substrate;
an excitation space provided on an upper surface of the IDT electrode;
an insulator layer disposed on the upper surface of the piezoelectric substrate, the insulator layer sealing the IDT electrode and the excitation space, the insulator layer including a resin and a filler dispersed in the resin;
a top plate electrode disposed in the insulator layer, the top plate electrode covering the excitation space;
a resin layer, distinct from the insulator layer, disposed on an upper surface of the insulator layer, the resin layer including no filler;
a first terminal electrode disposed on an upper surface of the resin layer; and
an inductor electrode disposed on the insulator layer and covered by the resin layer, the inductor electrode having a first end in electrical communication with the IDT electrode and a second end in electrical communication with the first terminal electrode and with the top plate electrode.

18. The elastic wave device of claim 17 further comprising:
a second terminal electrode disposed on the upper surface of the insulation layer;
a receiving filter having first ground wiring; and
a transmitting filter including a ladder type circuit including a parallel arm resonator, the parallel arm resonator including the IDT electrode, the IDT electrode having second ground wiring, the first end of the inductor electrode being electrically connected to the second ground wiring of the IDT electrode, the first ground wiring of the receiving filter being electrically connected to the top plate electrode and the second terminal electrode.

19. The elastic wave device of claim 17 further comprising:
a second terminal electrode disposed on the upper surface of the resin layer;
a receiving filter having the IDT electrode and a ground wiring, the ground wiring of the receiving filter being electrically connected to the top plate electrode and the second terminal electrode; and
a transmitting filter.

20. The elastic wave device of claim 17 wherein the inductor electrode is located directly under the first terminal electrode and occupies an area inside an outer periphery of the first terminal electrode.

* * * * *